United States Patent [19]
Luisi et al.

[11] 3,992,703
[45] Nov. 16, 1976

[54] MEMORY OUTPUT CIRCUIT

[75] Inventors: James A. Luisi, Anaheim; Clarence W. Padgett, Fountain Valley; Dana C. Street, Placentia, all of Calif.

[73] Assignee: Rockwell International Corporation, El Segundo, Calif.

[22] Filed: Aug. 13, 1975

[21] Appl. No.: 604,517

Related U.S. Application Data

[63] Continuation of Ser. No. 513,366, Oct. 9, 1974, abandoned.

[52] U.S. Cl. .......................... 340/173 R; 307/238; 307/243
[51] Int. Cl.² ................................ G11C 11/40
[58] Field of Search ................ 340/173 R, 173 DR; 307/238, 243, 246, 294

[56] References Cited
UNITED STATES PATENTS
3,942,160  3/1976  Yu ................................. 340/173 R Primary Examiner—Terrell W. Fears
Attorney, Agent, or Firm—H. Frederick Hamann; G. Donald Weber, Jr.; Morland C. Fischer

[57] ABSTRACT

A unique memory output integrated circuit disclosed including a memory output driver having an output terminal at which data may be read, a gated power amplifier, and a single ended multiplexer stage which, in the preferred embodiment, is adapted to be interfaced with a random access memory array comprised of a plurality of discrete, non-symmetrical memory cells. The integrated circuit is designed so that the space consumed thereby and the corresponding cost of production can be minimized.

16 Claims, 3 Drawing Figures

MEMORY OUTPUT CIRCUIT

This is a continuation of application Ser. No. 513,366, filed Oct. 9, 1974, now abandoned.

BACKGROUND OF THE INVENTION

1. Field of the Invention

This invention relates generally to a unique memory output integrated circuit of the type which may be fabricated from complementary metal oxide semiconductor devices and diodes utilizing silicon on sapphire technology and which may be interfaced with an array comprised of a plurality of memory cells.

2. Description of the Prior Art

Conventional integrated circuit, high speed random access memories have been known to include an associated memory output circuit of the type by which data may be read from an array of memory cells through the utilization of differential sensing of large transient signals between both a first data BIT bus line and a relatively opposite state second data $\overline{BIT}$ bus line. The data bus lines are connected to respective ends of each of the memory cells comprising the memory array. Several disadvantages are known to occur by using the conventional memory cell arrangements and their associated memory output circuits.

Since both of the BIT and $\overline{BIT}$ bus lines are utilized by the conventional output circuits for differential signal sensing, a relatively symmetrical memory cell has heretofore been required so as to be adapted to rapidly discharge either the BIT or the $\overline{BIT}$ bus lines during the read operation. Consequently, this has resulted in relatively large memory cell areas and increased costs per integrated circuit. Moreover, the associated conventional memory output circuits have included the use of relatively large numbers of logic gates and transistors so as to be capable of being interfaced with both the BIT and $\overline{BIT}$ bus lines. Consequently, the additional number of gates and other components have been known to inherently increase the time delay required for which data could be read out of a discrete memory cell.

SUMMARY OF THE INVENTION

Briefly, and in general terms, a unique integrated memory output circuit is disclosed which may be comprised of complementary metal oxide semiconductor transistors and diodes employing silicon on sapphire technology. The memory output circuit of the instant invention includes a memory output driver having a terminal thereof at which data may be read, a gated power amplifier-inverter stage, and a single ended multiplexer stage so as to provide interfacing means with a random access memory comprised of a plurality of discrete, non-symmetrical memory cells. A feedback path is connected from an output terminal of the power amplifier stage, through a control gate, and back to an input terminal of the power amplifier stage through a NOR gate. The feedback path control gate is provided with a periodic clock enabling signal input. The power amplifier, the NOR gate and the feedback path control gate form an output data latch whereby the binary state of the data at the output terminal of the power amplifier stage can be preserved when the clock input signal enables the control gate during that period of time corresponding to the recovery portion of the memory cycle.

DESCRIPTION OF THE PREFERRED EMBODIMENT

Figure 1:
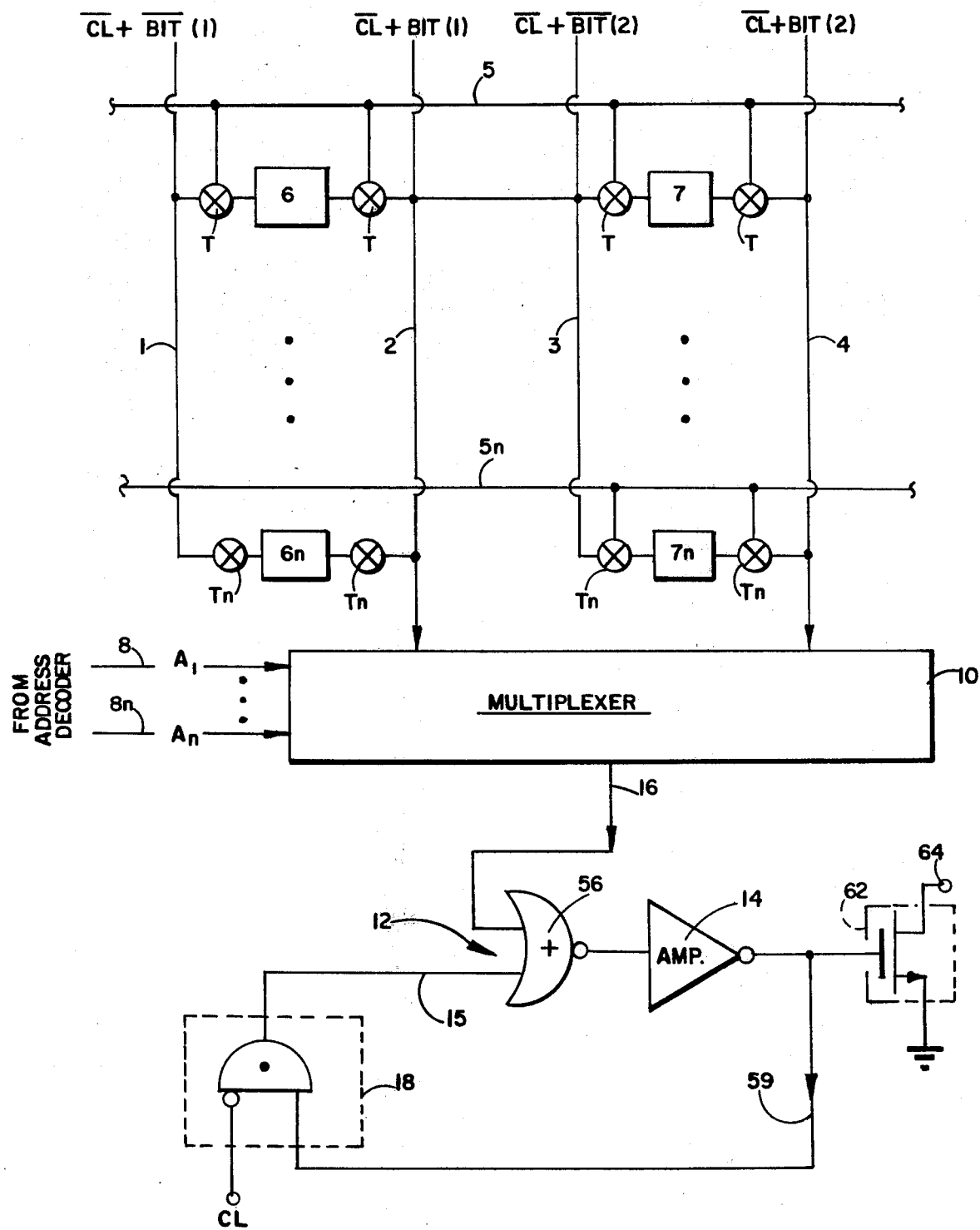
FIG. 1 is a block diagram showing an array of memory cells interfaced with the memory output circuit of the instant invention.

Referring to FIG. 1, a configuration is shown of a memory array comprised of a plurality of discrete memory cells to be interfaced with the integrated memory output circuit 12 of the instant invention. The configuration may include, but not to be regarded as a limitation thereof, an array comprising a plurality of columns of memory cells which may be randomly accessed. A first column of memory cells is represented at 6 through $6_n$ and a second column of memory cells is represented at 7 through $7_n$. Generally, but not as a limitation, each column may contain 32 memory cells. Each column of memory cells $6-6_n$ and $7-7_n$ includes a respective first clocked data BIT (1) or BIT (2) bus line 2 and 4. Each column of cells also includes a respective complementary clocked data $\overline{BIT}$ (1) or $\overline{BIT}$ (2) bus line 1 and 3. A logical "1" may be written into a memory cell of a particular column 6 or 7 by driving the respective data $\overline{BIT}$ bus lines 1 or 3 to a LOW logic level; and a logical "0" may be written into a memory cell by driving the respective data BIT bus line 2 or 4 to a relatively LOW logic level.

A plurality of row select or address lines 5 through $5_n$ are provided in order to have access to any particular memory cell location. Each memory cell also includes a respective pair of three terminal coupling devices T through $T_n$, as shown, which may be metal oxide semiconductor (MOS) field effect transistors (FETs). Coupling devices T through $T_n$ are connected between a memory cell and a data bus line, as illustrated. The third terminal of the coupling devices T through $T_n$ is connected to a respective row select line 5 through $5_n$.

In order that data may be read out of the memory cells by means of the instant output circuit 12, the BIT (1) and the BIT (2) data bus lines 2 and 4 are interfaced with a $n$-to-1 single ended multiplexer unit 10. Multiplexer 10 is adapted to sense large transient signals occurring either on the BIT (1) bus 2, or the BIT (2) bus 4. Other multiplexer inputs (e.g., which occur on lines 8 through $8_n$) include a plurality of multiplexer control signals conveniently designated by $A_1$ through $A_n$. Signals $A_1$ through $A_n$ are conducted from a suitable address decoder (not shown). It is to be understood that where two columns of memory cells (e.g., $6-6_n$ and $7-7_n$) are being employed, $n = 2$, and the corresponding multiplexer inputs would be designated by $A_1$ and $A_2$.

A single circuit line 16 connects the output of multiplexer 10 to one input terminal of two-input NOR gate 56. The output terminal of gate 56 is connected to an input terminal of amplifier 14. Gated power amplification stage 14 has a feedback path 59 associated therewith. Feedback path 59 includes a feedback control gate 18 connected therein. One input terminal of gate 18 is connected to the output terminal of amplifier 14. Another input terminal of gate 18 is connected to receive clock signal CL. The output terminal of gate 18 i connected to another input terminal of gate 56. Data may be read from the array of memory cells at the output terminal 64 of memory output driver 62. The input to memory output driver 62 is connected to the output of power amplifier 14. In a preferred embodiment, output driver 62 is a field effect transistor which has the gate electrode thereof connected to the output of amplifier 14. The operation of multiplexer 10, the memory output driver 62, the NOR gate 56, and the power amplifier stage 14, with its associated feedback path 59, which comprise the memory output circuit 12 of the instant invention, will be discussed in greater detail hereinafter.

Figure 2:
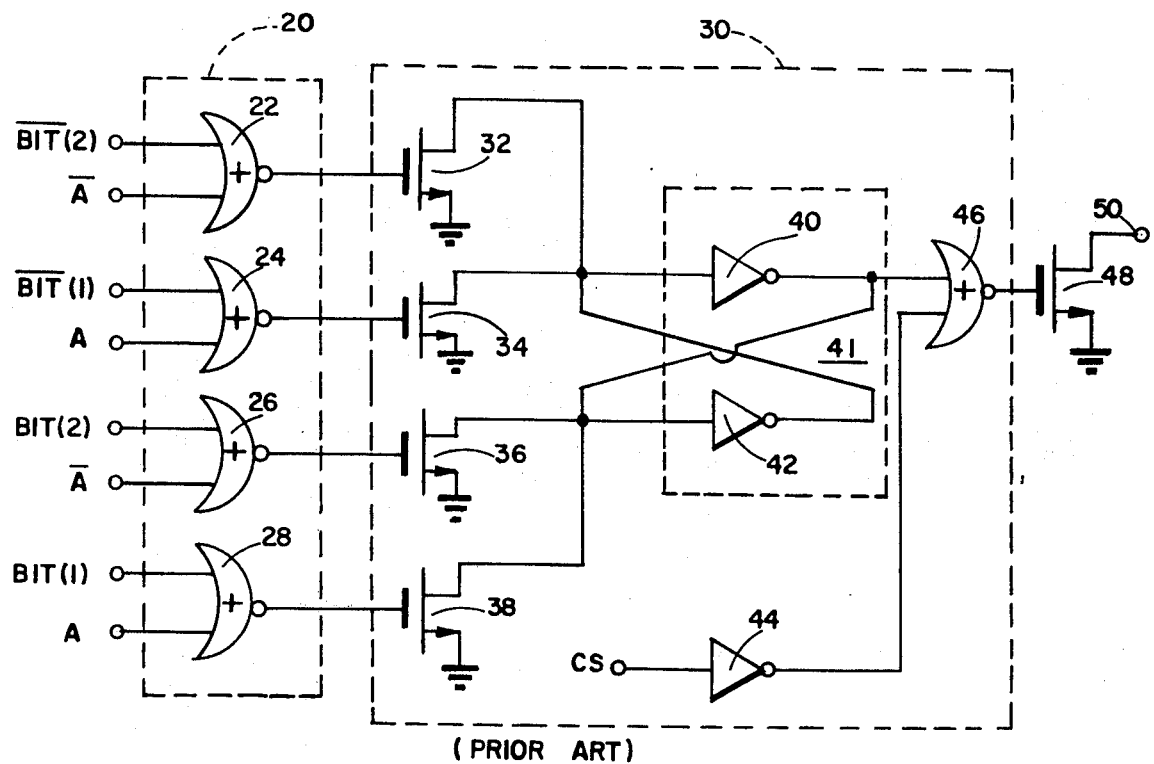
FIG. 2 shows an example of a prior art memory output circuit.

FIG. 2 represents an example of a prior art memory output circuit. Prior art output circuits, such as that shown, are known to read out information from an array of memory cells by utilizing differential sensing of large transient signal between both of the data bus lines. Consequently, the conventional output circuit requires the interfacing of a multiplexer 20 with both of the $\overline{BIT}$ (1) and $\overline{BIT}$ (2) data lines 1 and 3 as well as BIT (1) and BIT (2) data lines 2 and 4. Hence, the prior art output circuits require at least six multiplexer inputs (where two columns of memory cells are utilized), four of such inputs corresponding to a pair of data BIT and $\overline{BIT}$ input lines for each column of memory cells to be employed and the remaining two inputs corresponding to a pair of multiplexer control signals A or its respective complement signal $\overline{A}$, per column, as shown in the drawings. The prior art multiplexer 20 also requires at least four conventional two-input NOR gates 22, 24, 26 and 28 to receive the six multiplexer inputs. The prior art memory output circuit control stage 30 includes transistors (e.g., such as those represented by field effect transistors 32, 34, 36 and 38) connected to the output of NOR gates 22, 24, 26 and 28 respectively. The drain electrodes of each of the field effect transistors 32, 34, 36 and 38 are connected to the inputs of a conventional pair of cross coupled inverters 40 and 42 to form a well known bistable device, better known as a flip-flop 41. The output signal from the flip-flop 41 and an external binary chip select control signal, designated CS and applied through amplifier inverter 44, comprise the two input signals applied to NOR gate 46. Data is read from the open drain electrode terminal 50 of an output driver, such as field effect transistor 48. The output signal from NOR gate 46 is fed into the gate electrode of field effect transistor 48. Usually FET 48 is made as large as possible to accommodate the relatively large load capacitance thereof.

In operation, the disadvantages of a memory output circuit such as that shown in FIG. 2 become readily apparent. The quantity of (eight) gates and (four) FETs which comprise the prior art memory output control stage 30 and multiplexer 20 provide very little power amplification and consume relatively large amounts of area which consequently increase the cost of production of an integrated circuit. Since both $\overline{BIT}$ 1 and 3 and BIT 2 and 4 data bus lines (FIG. 1) are utilized during the readout operation (rather than just the BIT data bus lines 2 and 4 as provided in the instant invention), the plurality of associated memory cells have required a more stringent symmetrical mechanization in order to rapidly discharge either of the $\overline{BIT}$ (1) and (2) or BIT (1) and (2) data bus lines accordingly. Additionally, the memory cells are interfaced with a relatively complex multi-ended multiplexer 20, as shown, in order to accommodate the pairs of $\overline{BIT}$ and BIT data buses for performing the reading operation.

Typically, in the prior art configuration, NOR gate 46 is known to be comprised of two p-channel transistors (not shown) connected in series in order to switch data signals to a relatively positive potential or to a true logic level at the output terminal of NOR gate 46. This prior art technique for gating output driver 48 results in an undesirable and relatively slow read operation, because FET 48 is very large and has a large input gate capacitance. The on-resistances of the two aforementioned p-channel transistor switches of NOR gate 46 become additive, which significantly increases, e.g., doubles, the RC time constant between the NOR gate 46 and the output terminal 50 of driver FET 48. To reduce this inherent delay and thus permit rapid operating speed for the control circuitry 30, the channel widths of the two p-channel transistors are generally made relatively wide. However, this configuration further increases the capacitance loading on FET 48 and also increases the loading upon inverter stage 40 when it is required to drive NOR gate 46.

Figure 3:
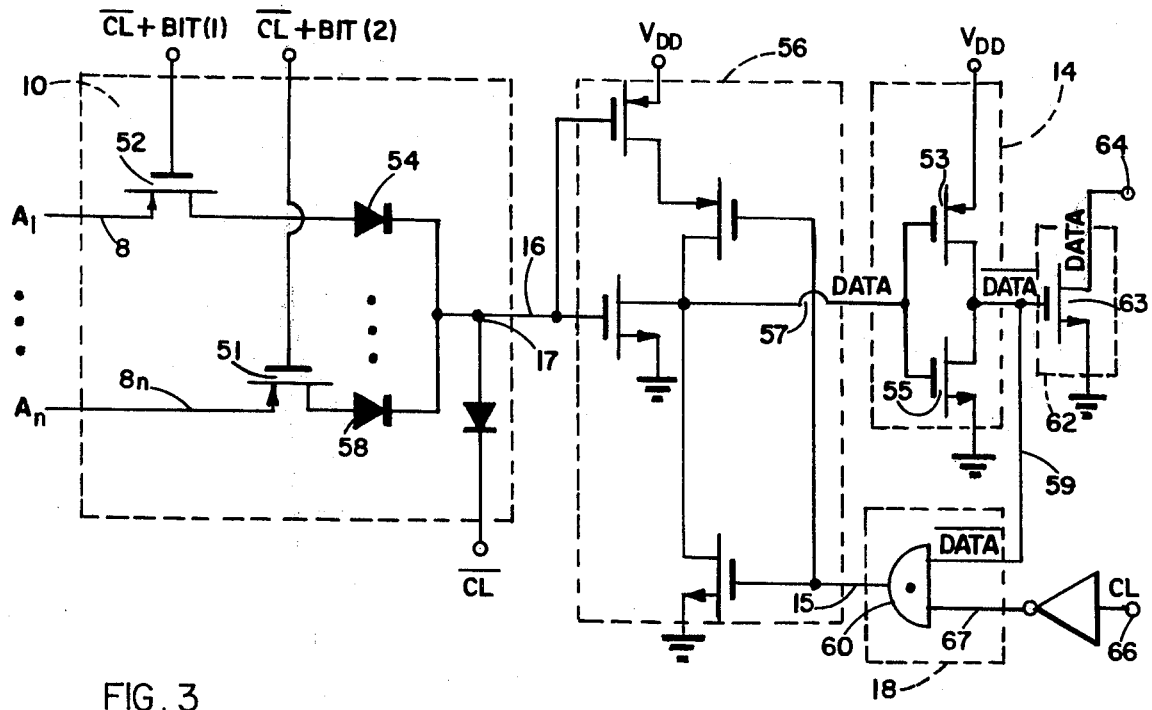
FIG. 3 is a detailed showing of the improved memory output circuit of the instant invention.

FIG. 3 is a more detailed showing of the integrated memory output circuit of the instant invention. This circuit is adapted to be formed from complementary metal oxide semiconductor (CMOS) field effect transistors and by means of conventional silicon on sapphire (SOS) technology. Single ended multiplexer 10 interfaces with the BIT data bus line from each column of memory cells (best shown in FIG. 1). As previously disclosed, only the BIT (1) and BIT (2) data bus lines 2 and 4 are used when reading out data from the memory cell array, as compared to both the BIT and $\overline{BIT}$ bus lines being required for reading out data when a prior art memory output circuit is utilized. Hence, a memory cell may be mechanized by a relatively non-symmetrical arrangement of components with a considerable increase in speed of readout accompanied by a space and a cost savings. For a more detailed description of one such nonsymmetrical memory cell, which may typically comprise the array of memory cells referred to herein, reference may be made to the copending U.S. patent application Ser. No. 513,367 filed Oct. 9, 1974, and entitled "High Speed Memory Cell" which has been assigned to the present assignee.

A fewer number of components, such as field effect transistors 51 and 52 and diodes 54 and 58 (when $n$, the number of memory cell columns, is 2) are required for mechanizing multiplexer 10, as compared to that of the prior art. In the preferred embodiment, the source-drain conduction paths of FETs 52 and 51 are arranged in a series circuit with diodes 54 and 58, respectively. The gate electrodes of FETs 52 and 51 are connected to the respective clocked BIT (1) or BIT (2) date bus lines, as shown. The specific arrangement, i.e., conduction direction, is a function of the remainder of the circuit and operation thereof. Diodes 54 and 58 and FETs 52 and 51 may be formed by conventional silicon on sapphire techniques. Diodes 54 and 58 will have virtually no capacitance thereacross and thus have advantageous coupling properties. For example, diode 54 isolates FET 52 form FET 51 when FET 52 is not rendered conductive. This prevents node 17 from becoming undesirably loaded by stray capacitance from other multiplexer nodes. The charge required on node 17 to activate the NOR gate 56 can thus be minimized and, consequently, the speed of the circuit improved.

Information stored in either of the two columns of memory cells is read over the BIT (1) bus line or the BIT (2) bus line, but not over both lines at the same time. A multiplexer input signal A1 through An selectively this operation by providing suitable address coding control. Inputs CL and $\overline{CL}$ are, in the preferred embodiment, external periodic, binary clock enabling signals which divide the time for each memory cycle into an active and a recovery portion. In effect, the clock signals provide the timing sequence for discharging or recharging the data BIT (1) or BIT (2) bus lines. The output signals from multiplexer 10 are conducted to a well known two-input NOR gate 36 comprised of two pairs of CMOS/FETs, as shown, by means of line 16. The binary signal (designated by DATA) at the output of NOR gate 56 is conducted to the power amplifier 14 by means of line 57. The power amplified DATA output signal, which has also been inverted by operation of amplifier 14, is applied to an electrode of the memory output driver 62, which may be the gate electrode of a suitable n-channel FET 63, as shown. The source electrode of output driver FET 62 is connected to a reference potential, such as ground. The drain electrode of FET 62 forms an open drain configuration with output terminal 64 at which information contained in any of the memory cells being interrogated can be read. An open drain configuration as that just described is well known to those skilled in the art.

In accordance with the instant invention, a feedback path 59 is connected from the output of amplifier 14 to form one input to the feedback path control block 18. In the preferred form, feedback control block 18 is comprised of an AND gate 60. A clock enabling signal CL is applied to terminal 66 and is then inverted to become the second input to AND gate 60, as illustrated in FIG. 3. Gate 60 may be mechanized by any convenient technique. As a suitable alternative, a clock signal $\overline{CL}$ may be applied directly to line 67 of AND gate 60 to form the second input thereof. The gated feedback signal from the output of AND gate 60 forms the second input to NOR gate 56 by means of line 15.

One advantage of control gate 60 is to form an output data latch with the gates 56 and 14 for the output DATA signal from gate 14. The data latch is to be activated when the periodic enabling clock signal CL applied to terminal 66 switches to a relatively false logic level. This will preferably occur during that point in time corresponding to the recovery part of the memory cycle at which data nodes are being charged back to their original states. Thus, the binary state of the $\overline{DATA}$ signal being applied to memory output driver 62 can be preserved along the feedback path 59 during the recovery part of the memory cycle. By preserving the output $\overline{DATA}$ signal, more time is made available to view the signal at the output terminal 64 of FET 63 than would be available with prior art output circuits. In fact, the $\overline{DATA}$ signal at the output of amplifier 14 may be conveniently re-examined at any time during the recovery part of the memory cycle. The $\overline{DATA}$ signal at the output of gate 14 will continue to be latched through feedback control gate 60 until the memory cycle has fully recovered to initiate the active part of the memory cycle anew and the clock signal Cl switches back to a relatively true logic level to thereupon reset AND gate 60. If FET 63 were previously on, it will be switched off, unless either of the data buses BIT (1) or BIT (2) switches to a relatively false logic level.

By virtue of the instant memory output circuit, power amplifier 14 is mechanized so as to produce relatively pure power amplification in the direction of output driver 62. Moreover, the amplifier gate 14 which drives output FET 62 is simply an amplifier-inverter which may be readily mechanized from one p-channel FET 53 and one n-channel FET 55. The relative simplicity by which amplifier-inverter 14 is mechanized helps to minimize the capacitance on line 57, and, thus, NOR gate 56 may be able to switch very rapidly.

Whenever the two data BIT (1) and BIT (2) bus lines are switched to a relatively true logic level, output driver FET 63 is permitted to float with respect to ground potential. This advantageously allows the open drain terminal 64 of FET 62 to be connected or be tied to other memory output drivers. The aforementioned arrangement would also facilitate gate 14 in being a relatively simple, single input inverter, as disclosed, instead of a more complex prior art multi-input gate such as that having an external binary signal (CS) as one input thereof.

It is to be understood that the data BIT and $\overline{BIT}$ bus lines cannot be discharged to a false or a relatively LOW logic level if the chip containing the particular memory output circuit is not selected. By virtue of the instant circuit, the required chip select signal may be provided by the data bus line control logic (not shown). As a result, the number of logic gates and other components needed to implement the instant circuit may be minimized.

An integrated memory output circuit of unique design has been disclosed which requires fewer components as compared to that of the prior art. Hence, the integrated circuit of the instant invention can be easier to build, consume less space, and consequently be less expensive than those of the prior art. At the same time, by virtue of the instant circuit, means have been provided to more effectively achieve power amplification and preserve output data from the memory array for continued examination during the inactive or recovery part of the memory cycle.

It will be apparent that while a preferred embodiment of the invention has been shown and described, various modifications and changes may be made without departing from the true spirit and scope of the invention. For example, while the instant memory output circuit is comprised, in the preferred embodiment, of complementary field effect transistors fabricated from silicon on sapphire techniques, it is to be understood that the transistors may also be fabricated by means of other suitable techniques, such as by self-aligned diffusion, and the like.

Having set forth a preferred embodiment of the invention, what is claimed is:

1. A memory output circuit including means to read data from an array comprised of a plurality of memory cells having a memory operating cycle comprising an active and a recovery portion, each of said memory cells connected between first and second data bus lines, and including a power amplifier having output and input data terminals to receive binary coded data from said memory cell array, first gate means connected to an input terminal of said power amplifier, interfacing means connected between the first data bus line and said first gate means, feedback path means connected from an output terminal of said power amplifier to said first gate means through a feedback control gate means, said feedback control gate means adapted to be enabled by a clock signal applied thereto in order to activate said feedback path means, and said power amplifier, said first gate means and said feedback control gate means forming an output data latch to preserve the binary state of the data at the output terminal of said power amplifier when said clock signal enables said feedback control gate means to activate said feedback path during a period of time corresponding to the recovery portion of said memory operating cycle.

2. The memory output circuit of claim 1, wherein said interfacing means includes a single ended multiplexer.

3. The memory output circuit of claim 2, wherein said multiplexer includes a field effect transistor comprising a layer of silicon on a sapphire substrate and having gate, source and drain electrodes thereof, said gate electrode connected to said first data bus and said source-drain conduction path connected to a current blocking means.

4. The memory output circuit of claim 3, wherein said current blocking means is a diode comprised of a layer of silicon on a sapphire substrate.

5. The memory output circuit of claim 1, wherein said power amplifier includes a pair of semiconductor devices interconnected so as to cause binary signals at the output terminal of said power amplifier to be inverted with respect to the signals at the input terminal thereof.

6. The memory output circuit of claim 5, wherein said pair of semiconductor devices are complementary metal oxide field effect transistors comprising a layer of silicon on a sapphire substrate.

7. The memory output circuit of claim 1, wherein the means for reading data from said array of memory cells is a field effect transistor connected to the output terminal of said power amplifier, said field effect transistor having gate, source and drain electrodes thereof, said gate electrode connected to the output terminal of said power amplifier and said drain electrode having an open drain arrangement.

8. The memory output circuit of claim 1, wherein said first gate means is a NOR gate.

9. The memory output circuit of claim 1, wherein said feedback control gate means is an AND gate.

10. The combination of at least one memory cell means and an output data latching circuit, said latching circuit comprising:

first signal gating means having input and output terminal means;

means to connect said memory cell means to said input terminal means of said first signal gating means;

utilization means connected to the output terminal means of said first signal gating means to receive a signal therefrom;

feedback means connected between said first signal gating means output terminal means and the input terminal means thereof for preserving the binary state of the signal at said output terminal means of said first signal gating means; and said feeback means including second signal gating means, said second signal gating means controlling the conductivity of said feedback means.

11. The combination recited in claim 10, wherein said second signal gating means includes first and second input terminals;

said first input terminal connected to said output terminal means of said first signal gating means; and said second input terminal connected to a source of clock signals to synchronously control the conductivity of said feedback means.

12. The combination recited in claim 10, said second signal gating means including an AND gate.

13. The combination recited in claim 10, said first signal gating means including a NOR gate.

14. The combination recited in claim 13, said first signal gating means further including power amplification means connected to said NOR gate to receive a signal therefrom.

15. The combination recited in claim 10, the means to connect said memory cell means to the first input terminal means of said first signal gating means including a multiplexer means.

16. The combination of claim 10, wherein said utilization means includes a field effect transistor having gate, source and drain electrodes, said gate electrode connected to said output terminal means of said first signal gating means, said source electrode connected to a reference potential source means and said drain electrode having an open drain arrangement.

* * * * *